(12) United States Patent
Maurelli

(10) Patent No.: US 7,410,872 B2
(45) Date of Patent: Aug. 12, 2008

(54) SEALING METHOD FOR ELECTRONIC DEVICES FORMED ON A COMMON SEMICONDUCTOR SUBSTRATE AND CORRESPONDING CIRCUIT STRUCTURE

(75) Inventor: Alfonso Maurelli, Sulbiate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/457,966

(22) Filed: Jul. 17, 2006

(65) Prior Publication Data

US 2007/0026576 A1 Feb. 1, 2007

Related U.S. Application Data

(63) Continuation-in-part of application No. 10/971,774, filed on Oct. 22, 2004, now Pat. No. 7,078,294.

(30) Foreign Application Priority Data

Oct. 22, 2003  (EP) .................................. 03425687

(51) Int. Cl.
*H01L 21/336* (2006.01)
(52) U.S. Cl. ................. 438/258; 257/499; 257/E21.626
(58) Field of Classification Search .................. 438/258; 257/499, E21.626
See application file for complete search history.

(56) References Cited

U.S. PATENT DOCUMENTS 6,468,867 B1  10/2002  Lai et al. ..................... 438/275
6,506,647 B2  1/2003  Kuroda et al. ............... 438/275
6,630,378 B1  10/2003  Tanigawa ..................... 438/210
6,798,002 B1  9/2004  Ogle et al. ................... 257/295
2003/0151069 A1  8/2003  Sugimae et al. ............. 257/200

OTHER PUBLICATIONS

Patent Abstracts of Japan, vol. 1996, No. 10, Oct. 31, 1996 & JP 08 153860 A, Mitsubishi Electric Corp., Jun. 11, 1996.

*Primary Examiner*—Lex Malsawma
(74) *Attorney, Agent, or Firm*—Lisa K. Jorgenson; Allen, Dyer, Doppelt, Milbrath & Gilchrist, P.A.

(57) ABSTRACT

A method for sealing electronic devices formed on a semiconductor substrate includes forming a plurality of first electronic devices adjacent a first portion of the semiconductor substrate, with each first electronic device including a first region comprising at least one first conductive layer projecting from the semiconductor substrate. A first sealing layer is formed adjacent the first regions for sealing the plurality of first electronic devices. A protective layer is formed adjacent the first sealing layer. The protective layer is etched to form protective spacers adjacent sidewalls of the first regions. The method further includes forming a plurality of second electronic devices adjacent a second portion of the semiconductor substrate, with each second electronic device including a second region comprising a second conductive layer projecting from the semiconductor substrate. A second sealing layer is formed adjacent the second regions for sealing the plurality of second electronic devices, and adjacent the first sealing layer for sealing the plurality of first electronic devices.

41 Claims, 3 Drawing Sheets

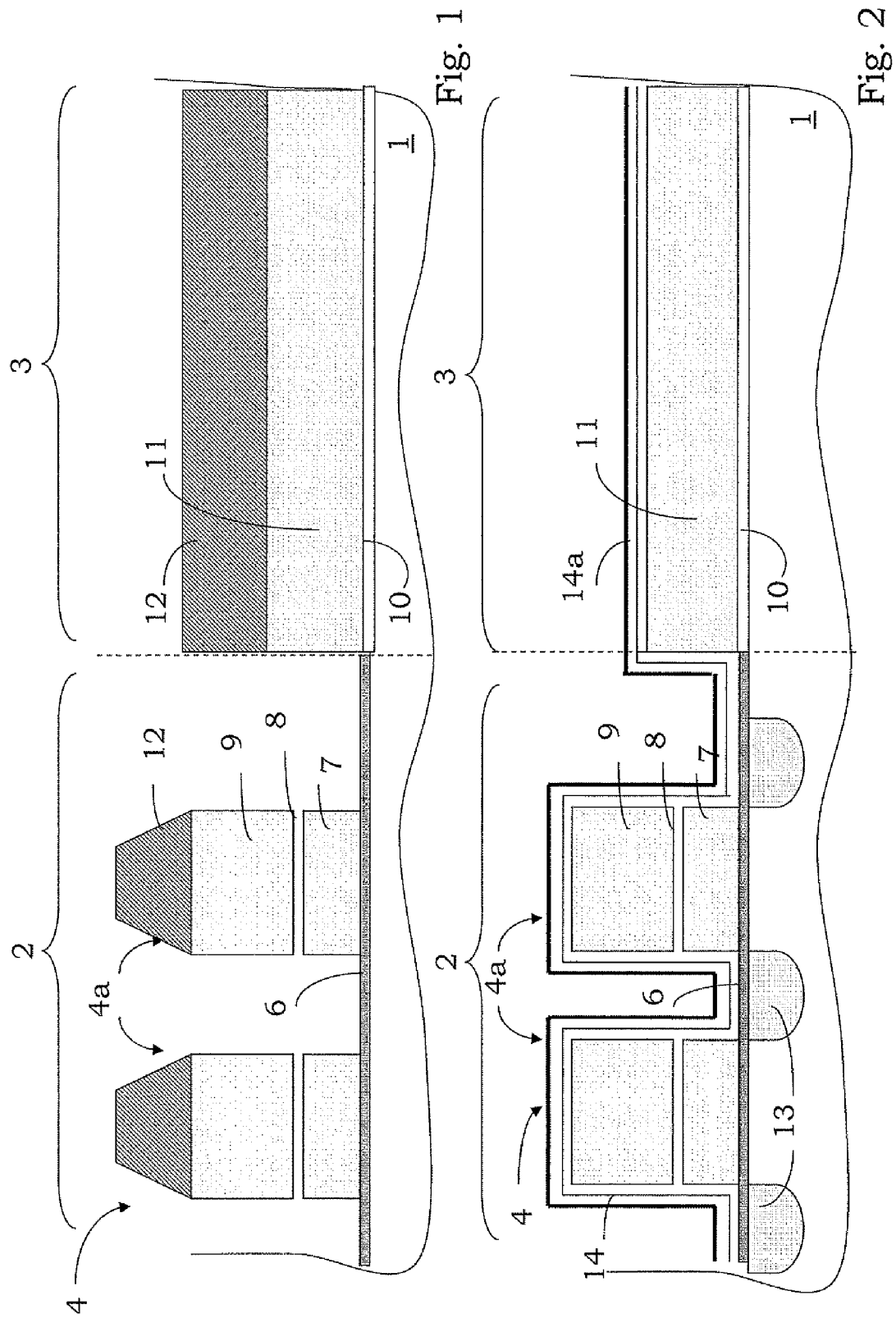

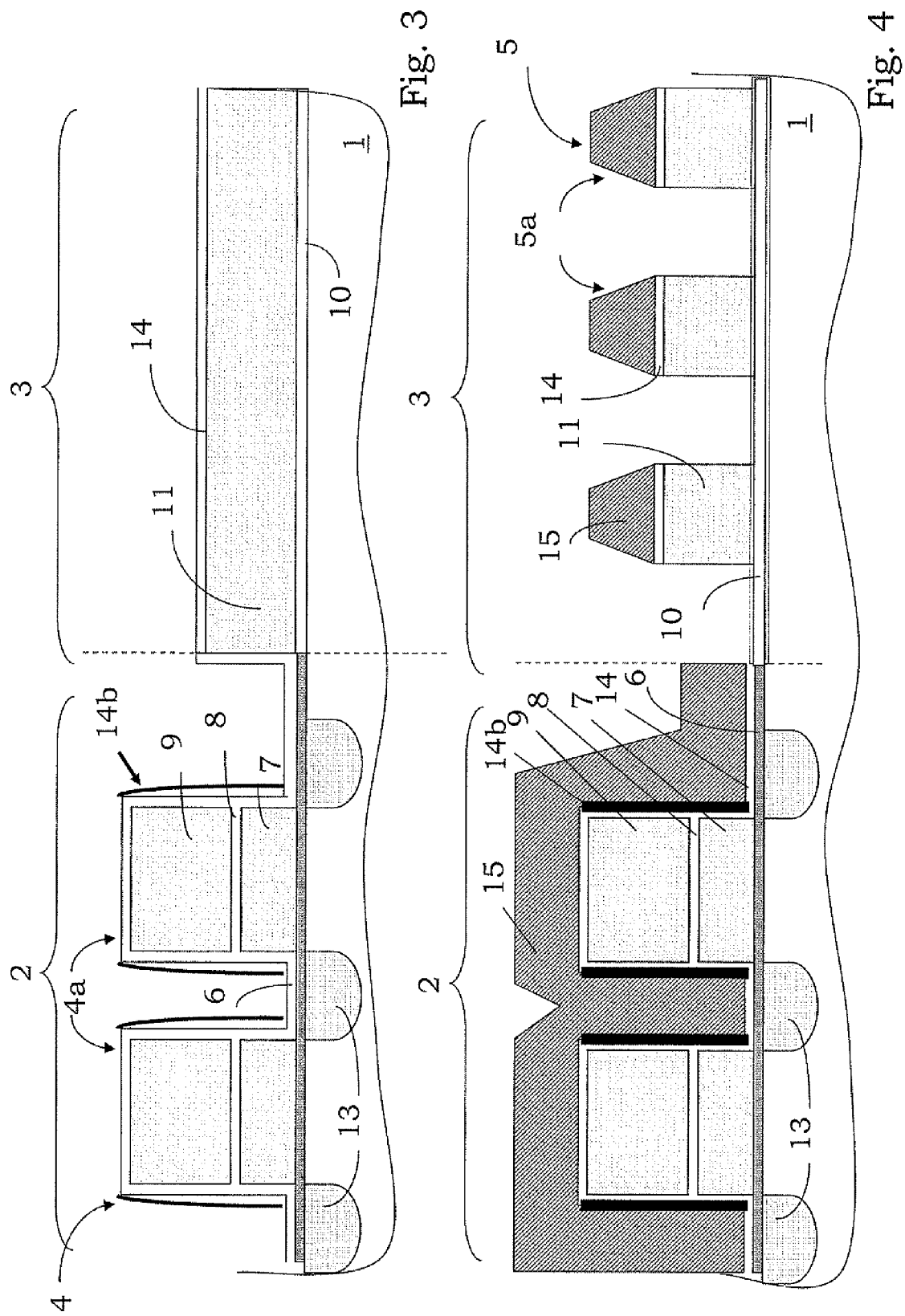

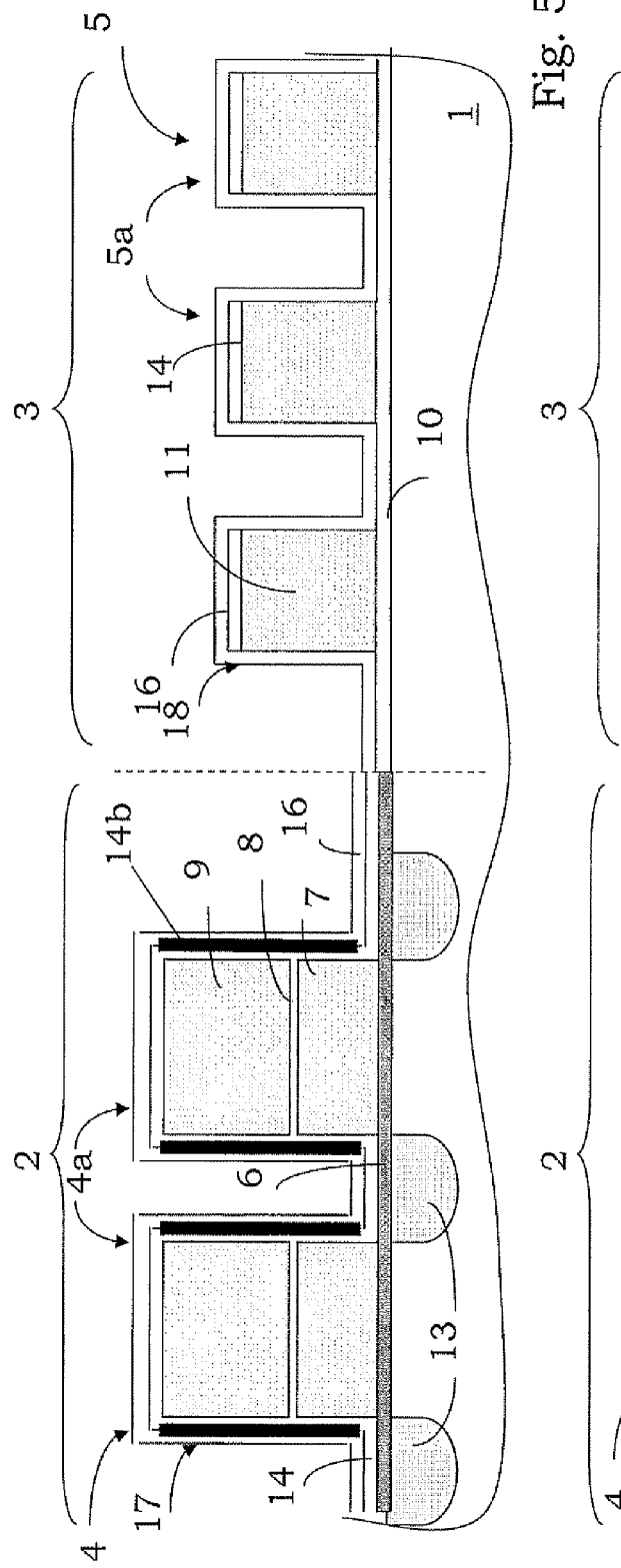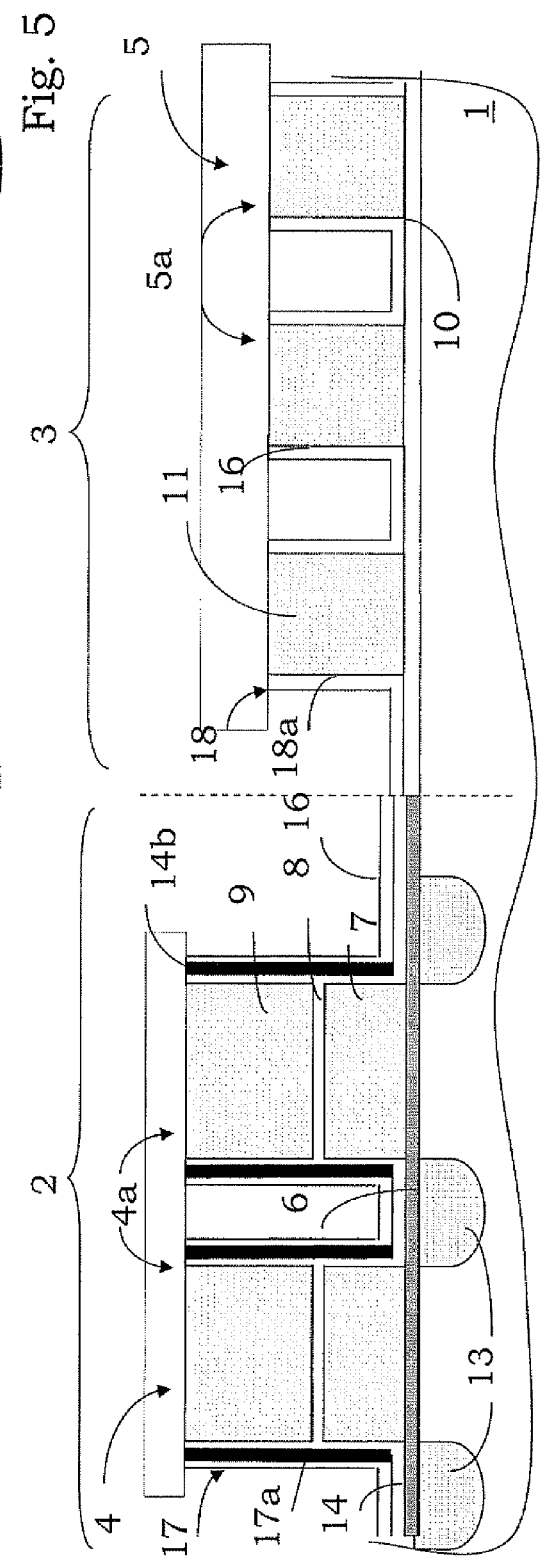

SEALING METHOD FOR ELECTRONIC DEVICES FORMED ON A COMMON SEMICONDUCTOR SUBSTRATE AND CORRESPONDING CIRCUIT STRUCTURE

RELATED APPLICATION

The present application is a continuation-in-part of U.S. patent application Ser. No. 10/971,774 filed Oct. 22, 2004 now U.S. Pat. No. 7,078,294, the disclosure of which is incorporated herein by reference.

FIELD OF THE INVENTION

The present invention relates to integrated circuits with electronic devices having different types of sealing structures. The present invention relates more particularly, but not exclusively, to a differential sealing method for non-volatile memory cells with a double polysilicon level and transistors associated therewith, formed on a common semiconductor substrate. The following description is made with reference to this field of application for convenience of illustration only.

BACKGROUND OF THE INVENTION

The integration on a common semiconductor substrate of different electronic devices, such as traditional transistors and non-volatile memory cells with a double polysilicon level for example, presents the problem of reconciling the different needs for sealing these two different types of electronic devices. Sealing refers to the manufacturing process where one or more layers are formed after the polysilicon layer forming the gate regions of the transistors and memory cells have been formed. This manufacturing process seals these electronic devices.

Typically, memory cells undergo a high quality sealing step to ensure the retention properties of the charge stored in the floating gate region. For transistors, a protection layer formed as part of this sealing step is to provide protection from the subsequent process steps.

A prior art approach provides the use of two different photolithographic masks to first define the gate regions in a memory matrix, and then those of the circuitry even if the order is not significant. Afterwards, the simultaneous oxidation of both electronic devices occurs, thus sealing the devices by a single sealing layer.

Although advantageous, this approach has several drawbacks as the size of the electronic devices decreases. In fact, the continuous reduction in the size of the electronic devices pushes transistors to require thinner sealing layers, and heat treatments with lower temperatures. This is in contrast to memory cells requiring thicker layers in addition to higher quality requirements.

In addition, CMOS transistors may be formed on the same semiconductor substrate where memory cells are formed. However, in the treatments most commonly used in CMOS transistor manufacturing process etching, the oxide layer is used to seal the memory cells. This reduces the retention properties of the charge stored in the floating gate region.

SUMMARY OF THE INVENTION

In view of the foregoing background, an object of the present invention is to provide an independent sealing method for electronic devices formed on a common semiconductor substrate that does not jeopardize individually optimized performances and reliability of these devices, and may not require further steps or masks beyond those for a traditional process flow.

This and other objects, advantages and features in accordance with the present invention are provided by a method for sealing electronic devices formed adjacent a semiconductor substrate comprising forming at least one first conductive layer adjacent a first portion of the semiconductor substrate and forming a second conductive layer adjacent a second portion of the semiconductor substrate. A first plurality of regions in the at least one first conductive layer may be formed for defining first electronic devices adjacent the first portion of the semiconductor substrate. A first sealing layer may be formed adjacent the first plurality of regions for sealing the first electronic devices. A protective layer may be formed adjacent all of the first sealing layer. Then, the protective layer may be etched to form protective spacers adjacent sidewalls of the first plurality of regions. A second plurality of regions in the second conductive layer may be formed for defining second electronic devices adjacent the second portion of the semiconductor substrate. A second sealing layer may be formed adjacent the second plurality of regions for sealing the second electronic devices, and adjacent the first sealing layer for sealing the first electronic devices.

Another aspect of the present invention is directed to an integrated circuit comprising a semiconductor substrate including first and second portions, and a plurality of first electronic devices adjacent the first portion of said semiconductor substrate. Each first electronic device may include a first region comprising at least one first conductive layer projecting from the semiconductor substrate. A first sealing layer may be adjacent the plurality of first electronic devices. Protective spacers may be adjacent sidewalls of the plurality of first electronic devices. A plurality of second electronic devices may be adjacent the second portion of the semiconductor substrate. Each second electronic device may include a second region comprising a second conductive layer projecting from the semiconductor substrate. A second sealing layer may be adjacent the plurality of second electronic devices and adjacent the first sealing layer for sealing the plurality of first electronic devices and the protective spacers.

Yet another aspect of the present invention is directed to an integrated circuit comprising a semiconductor substrate including first and second portions. A plurality of first electronic devices may be adjacent the first portion of the semiconductor substrate. Each first electronic device may include a first region comprising at least one first conductive layer projecting from the semiconductor substrate. First spacers are adjacent sidewalls of the first regions of the plurality of first electronic devices. The first spacers may be defined by a first sealing layer, a protective layer and a second sealing layer adjacent one another. A plurality of second electronic devices may be adjacent the second portion of the semiconductor substrate. Each second electronic device may include a second region comprising a second conductive layer projecting from the semiconductor substrate. Second spacers are adjacent sidewalls of the second regions of the plurality of second electronic devices. The second protective spacers may be defined by other portions of the second sealing layer.

BRIEF DESCRIPTION OF THE DRAWINGS

The features and advantages according to the invention will be apparent from the following description of an embodiment thereof given by way of a non-limiting example with reference to the attached drawings. In the drawings:

FIGS. 1 to 6 are cross-sectional views of different portions of a semiconductor substrate based upon a manufacturing method according to the invention.

DETAILED DESCRIPTION OF THE PREFERRED EMBODIMENTS

With reference to FIGS. 1 to 6, a method for sealing electronic devices formed on a common semiconductor substrate in an independent manner, and the corresponding circuit structure will now be described. The method steps described below do not form a complete process flow for manufacturing integrated circuits. The present invention can be implemented together with the integrated circuit manufacturing techniques presently used in this field, and only those commonly used process steps necessary to understand the present invention are presented.

Referring now to FIG. 5, an integrated circuit is formed on a semiconductor substrate 1. The integrated circuit includes first and second portions 2, 3 wherein a first plurality of electronic devices 4, such as non-volatile memory cells for example, are formed on the first portion 2. Each of these electronic devices 4 comprises a region 4a projecting from the semiconductor substrate 1, formed for example, by one or more conductive layers 7, 9 being electrically insulated from each other by an insulating layer 8. The region 4a is coated with a first sealing structure 17 of a first thickness for sealing the electronic devices 4.

This first sealing structure 17 comprises a plurality of layers: a first sealing layer 14, protective spacers 14b on sidewalls of the region 4a, and a second sealing layer 16.

A first insulating layer 6 isolates the region 4a projecting from the semiconductor substrate 1, and this first insulating layer 6 is on the whole substrate in the first portion 2.

The first sealing layer 14 covers portions of the exposed first insulating layer 6 between the single electronic devices 4. If the first insulating layer 6 has been etched during the formation step of the region 4a projecting from the semiconductor substrate 1, the first sealing layer 14 covers portions of the exposed semiconductor substrate 1 between the single electronic devices 4.

In the first portion 2, the second sealing layer 16 coats the first sealing layer 14 and the protective spacers 14b.

The semiconductor substrate 1 also comprises a second plurality of electronic devices 5, for example, transistors formed on a second portion 2. Each of these electronic devices 5 comprises a region 5a projecting from the semiconductor substrate 1, formed for example, by at least one conductive layer 11. The region 5a is coated with a second sealing structure 18 for sealing the electronic devices 5. Advantageously, the second sealing structure 18 has a lower thickness than the thickness of the first sealing structure 17 covering the electronic devices 4.

The second sealing structure 18 has a lower thickness on the vertical walls of the region 5a, while it has a higher thickness on the top of this region 5a. It is thus possible to form very close electronic devices 5 allowing for a higher integration scale.

The second sealing structure 18 comprises at least one insulating layer 16. A second insulating layer 10 isolates the region 5a projecting from the semiconductor substrate 1, and this layer 10 is on the whole substrate in the second portion 3.

The insulating layer 16 covers portions of the exposed second insulating layer 10 between the single electronic devices 5. If the second insulating layer 10 has been etched during the formation step of the region 5a projecting from the semiconductor substrate 1, the insulating layer 16 covers portions of the exposed semiconductor substrate 1 between the single electronic devices 5.

A manufacturing method of an integrated circuit as described above will now be described. In particular, and by way of example, a method for integrating non-volatile flash memory cells with transistors formed in CMOS technology is below.

A matrix of cells, formed on a first portion 2 of the integrated circuit, with associated control circuitry formed on a second portion 3 of the integrated circuit, is formed on a semiconductor substrate 1. The cell matrix 2 comprises a plurality of non-volatile memory cells 4, while the control circuitry comprises a plurality of transistors 5.

A manufacturing process well known to one skilled in the art for forming the cell matrix includes formation, on the semiconductor substrate 1 in cascade, a first insulating layer 6, for example silicon oxide, a first conductive layer 7, for example polysilicon, a second insulating layer 8, for example silicon oxide, and a second conductive layer 9, for example polysilicon. The formation of a third insulating layer 10, for example silicon oxide, and a third conductive layer 11, for example polysilicon, is instead provided to form the circuitry.

The third conductive layer 11 is formed simultaneously with the first conductive layer 7 or with the second conductive layer 9. The third insulating layer 10 is formed simultaneously with the first insulating layer 6 or with the second insulating layer 8. A first photoresist material layer 12 is then deposited on the whole semiconductor substrate 1.

By using a traditional photolithographic technique, the first photoresist layer 12 is etched to define a plurality of gate regions 4a of the memory cells 4. This is while a portion of the first photoresist material layer 12 in the circuitry 3 is left to screen the third conductive layer 11, as shown in FIG. 1.

The definition of the gate regions 4a of the memory cells 4 is completed through an etching step of the second conductive layer 9, of the second insulating layer 8 and of the first conductive layer 7, in cascade.

The first insulating layer 6 is also etched, and portions of the semiconductor substrate 1 between the gate regions 4a of the memory cells 4 are exposed. Before that the first photoresist material layer 12 is removed, and implants are carried out to form source and drain regions 13 of the memory cell 4. These implants are optimized to improve memory cell 4 performances.

Memory cells 4 are then sealed forming a first sealing layer 14, for example, through a high-temperature fast oxidation step. A thickness of the first sealing layer 14 is within a range of 3-15 nm, for example, about 8 nm.

The sealing layer 14 coats not only the gate regions 4a of memory cells 4, but also covers portions of the first insulating layer 6 or the semiconductor substrate 1 if the first insulating layer 6 has been removed. That is, the semiconductor substrate 1 has been left exposed in the matrix 2, and portions are not covered by the gate regions 4a. The third conductive layer 11 is not yet defined in the circuitry.

A protective layer 14a is formed on all of the first sealing layer 14, as shown in FIG. 2. In particular, the protective layer 14b is made by a material that can be highly selectively etched with respect to the material forming the first sealing layer 14.

The protective layer 14a is made by a nitride layer because this material cannot be etched during the subsequent conventional steps used in the CMOS manufacturing process. The subsequent conventional steps include, for example, etching cleaning or oxidation steps.

The protective layer 14a is within a range of 3-10 nm thick, for example about 5 nm.

As show in FIG. 3, an etching step of the protective layer 14a is then carried out to form protective spacers 14b on sidewalls of the gate regions 4a on the first insulating layer 6. The sidewalls are coated by the first sealing layer 14. In particular, the protective layer 14a is completely removed from the horizontal surfaces, i.e., from the surfaces that are parallel to the semiconductor substrate 1 surface.

This step is carried out by a highly anisotropic etching, for example, of a dry type.

A second photoresist material layer 15 is then deposited on the whole semiconductor substrate 1. By using a traditional photolithographic technique, the second photoresist layer 15 is then etched to define a plurality of gate regions 5a of the transistors 5, while a portion of the second photoresist material layer 15 on the matrix 2 is left to screen the memory cells 4 of the matrix 2, as shown in FIG. 4.

In particular, the circuitry portions that are uncovered by the photoresist layer 15 first undergo an etching step to remove the first sealing layer 14, and then an etching step to remove the conductive layer 11.

The third insulating layer 10 is also removed, and portions of the semiconductor substrate 1 between the gate regions 5a of transistors 5 are exposed.

With the photoresist layer 15 removed, transistors 5 are sealed by forming a second thin sealing layer 16. The thickness of the second thin sealing layer 16 is between 1-4 nm, for example, about 2 nm.

The second sealing layer 16 coats not only the gate regions 5a of the transistors 5, but it also covers portions of the third insulating layer 10 between the gate regions 5a of the transistors 5, or exposed portions of the semiconductor substrate 1 between the gate regions 5a of the transistors 5 if the third insulating layer 10 has been removed.

The second thin sealing layer 16 completely covers the first sealing layer 14 and the protective spacers 14b. The second thin sealing layer 16 is an oxide layer that is formed on the whole integrated circuit.

In one embodiment, a first sealing structure 17 is formed comprising the first sealing layer 14, the protective spacers 14b and the second sealing layer 16, which laterally isolates the gate regions 4a of the memory cells 4. In particular, the first sealing layer 14 completely coats the gate regions 4a of the memory cells 4.

Moreover, in this embodiment a second sealing structure 18 is formed that completely coats the gate regions 5a of the transistors 5 in order to seal them. The second sealing structure 18 comprises the second sealing layer 16, and portions of the first sealing layer 14 which are on the upper portions of the gate regions 5a of the transistors 5.

Moreover, the definition step of the gate regions 5a of the transistors 5 is performed after the deposition step of the first sealing layer 14, and forms projecting regions having portions of the sealing layer 14 on the top thereof, but not on the side walls thereof.

The formation of the second thin sealing layer 16 does not affect the electric capacities of the cells 4. This is because the source and drain regions 13 in the matrix 2 have already been formed, and because the heat treatments involved in the formation of the second thin sealing layer 16 are performed at lower temperatures than the temperatures undergone by the cells 4 for the specific sealing thereof.

The manufacturing method according to the invention is completed according to the prior art.

In a further embodiment of the invention, as shown in FIG. 6, top portions of the first sealing structure 17 are removed up to a top surface of the gate regions 4a of the memory cells 4, and which are exposed. This is done to permit the silicidation step of these gate regions 4a. First spacers 17a formed by the first sealing layer 14, the protective spacers 14b and the second sealing layer 16 are on the sidewalls of the gate regions 4a of the memory cells 4.

Advantageously, top portions of the second sealing structure 18 are removed up to the top surface of the gate regions 5a of the transistors 5 to permit the silicidation step of the gate regions 5a. Second spacers 18a comprising the second sealing layer 16 are formed on sidewalls of the gate regions 5a of the transistors 5. The second spacers 18a have a width W2 narrower that a width W1 of the first spacers 17a.

The protective spacers 14b are advantageously formed only on the sidewalls of the region 4a, and no additional steps are required to remove the sealing structures 17, 18 from the top surface of gate the regions 4a, 5a to carry out the silicidation step in conventional manufacturing processes.

Therefore, in this embodiment of the invention, a first sealing structure 17 is formed by the first spacers 17b. Similarly, the second sealing structure 18 is formed by the second spacer 18a.

Both traditional memory cells 4 and traditional CMOS transistors 5 can be successfully integrated on the common semiconductor substrate 1, while penalizing neither the performances nor the reliability. The following differences are with respect to prior art methods: each definition of the projecting 4a and gate 5a regions, first in the matrix and then in the circuitry, is followed by a respective sealing step which is optimized by using sealing layers 14, 16 of different thicknesses and/or materials; and the formation of the protective spacers 14b on the sidewalls of the gate regions 4a of the memory cells 4, with the sidewalls being covered by a sealing layer 14.

In an alternative embodiment, immediately after the formation of the first sealing layer 14 and the protective spacer 14b, an additional mask is used to leave only the circuitry 3 exposed The first sealing layer 14 is then removed from the conductive layer 11 before defining real gate regions 5a in the circuitry 3.

In this embodiment, the second sealing structure 18 for sealing the gate regions 5a of the transistors 5 is formed by the second sealing layer 16. This alternative embodiment is advantageously applied when the materials used to form the first sealing layer 14 for sealing the memory cells 4 are different from thermal oxide, and need to be necessarily removed to allow the conductive layer 11 to be correctly etched to define gate regions 5a in the circuitry 3.

In conclusion, the method according to the invention allows typologies of electronic devices requiring different types of sealing to be integrated without jeopardizing the individually optimized performances and reliability for each device. In particular, the presence of the protective spacer 14b preserves the first sealing layer 14 from the etching steps that conventionally are used in standard CMOS manufacturing processes. The sealing step of these electronic devices is achieved by sealing layers with different thickness, and in case, also comprising materials being formed immediately after defining the devices of the matrix 2 and of the circuitry 3.

That which is claimed:

1. A method for sealing electronic devices formed on a semiconductor substrate comprising:

forming a plurality of first electronic devices adjacent a first portion of the semiconductor substrate, each first electronic device including a first region comprising at least one first conductive layer projecting from the semiconductor substrate;

forming a first sealing layer on the first regions including sidewalls thereof for sealing the plurality of first electronic devices;

forming a protective layer on the first sealing layer;

etching the protective layer to form protective spacers on the first sealing layer for the first regions;

forming a plurality of second electronic devices adjacent a second portion of the semiconductor substrate, each second electronic device including a second region comprising a second conductive layer projecting from the semiconductor substrate; and forming a second sealing layer on the second regions including sidewalls thereof for sealing the plurality of second electronic devices, and on the first sealing layer for sealing the plurality of first electronic devices;

said second sealing layer covering top portions of said second regions of said plurality of second electronic devices, with said first sealing layer between the top portions and said second sealing layer.

2. A method according to claim 1, wherein the protective layer is selectively etched with respect to the first sealing layer.

3. A method according to claim 1, wherein the protective layer comprises a silicon nitride layer.

4. A method according to claim 1, wherein the first sealing layer is formed adjacent the second conductive layer.

5. A method according to claim 1, wherein a thickness of the second sealing layer is different from a thickness of the first sealing layer.

6. A method according to claim 5, wherein the thickness of the second sealing layer is less than the thickness of the first sealing layer.

7. A method according to claim 1, wherein a thickness of the second sealing layer is within a range of about 1 to 4 nm, and a thickness of the first sealing layer is within a range of about 3 to 15 nm.

8. A method according to claim 1, wherein forming the at least one first conductive layer comprises forming a lower conductive layer, a dielectric layer adjacent the lower conductive layer, and an upper conductive layer adjacent the dielectric layer.

9. A method according to claim 8, wherein the upper conductive layer is formed when the second conductive layer is formed.

10. A method according to claim 1, wherein the first sealing layer is formed adjacent the semiconductor substrate between the plurality of first electronic devices; and further comprising forming a first insulating layer between the first sealing layer and the semiconductor substrate, and between the plurality of first electronic devices and the semiconductor substrate.

11. A method according to claim 1, wherein the second sealing layer is formed adjacent the semiconductor substrate between the plurality of second electronic devices; and wherein a second insulating layer is formed between the second sealing layer and the semiconductor substrate, and between the plurality of second electronic devices and the semiconductor substrate.

12. A method for making an integrated circuit comprising:
forming at least one first conductive layer adjacent a first portion of a semiconductor substrate;
forming a second conductive layer adjacent a second portion of the semiconductor substrate;
forming a plurality of memory cells in the at least one first conductive layer and the first portion of the semiconductor substrate;

forming a first sealing layer on the plurality of memory cells including sidewalls thereof;

forming protective spacers on the first sealing layer for the plurality of memory cells, each protective spacer comprising a protective layer;

forming a plurality of transistors in the second conductive layer; and forming a second sealing layer on the plurality of transistors including sidewalls thereof, and directly on the first sealing layer.

13. A method according to claim 12, wherein each protective layer comprises a silicon nitride layer.

14. A method according to claim 12, wherein the first sealing layer is formed on the second conductive layer.

15. A method according to claim 12, wherein the thickness of the second sealing layer is less than the thickness of the first sealing layer.

16. A method according to claim 12, wherein a thickness of the second sealing layer is within a range of about 1 to 4 nm, and a thickness of the first sealing layer is within a range of about 3 to 15 nm.

17. A method according to claim 12, wherein the first sealing layer is formed adjacent the semiconductor substrate between the plurality of memory cells; and wherein a first insulating layer is formed between the first sealing layer and the semiconductor substrate, and between the plurality of memory cells and the semiconductor substrate.

18. A method according to claim 12, wherein the first sealing layer is also formed between top portions of the plurality of transistors and the second sealing layer.

19. A method according to claim 12, wherein the second sealing layer is formed adjacent the semiconductor substrate between the plurality of transistors; and wherein a second insulating layer is formed between the second sealing layer and the semiconductor substrate, and between the plurality of transistors and the semiconductor substrate.

20. A method according to claim 12, further comprising removing a portion of the first sealing layer and a portion of the second sealing layer for exposing an upper surface of the at least one conductive layer.

21. An integrated circuit comprising:
a semiconductor substrate including first and second portions;
a plurality of first electronic devices adjacent the first portion of said semiconductor substrate, each first electronic device including a first region comprising at least one first conductive layer projecting from said semiconductor substrate;
a first sealing layer on said plurality of first electronic devices including sidewalls thereof;
protective spacers on said first sealing layer for said plurality of first electronic devices, each protective spacer comprising a protective layer;
a plurality of second electronic devices adjacent the second portion of said semiconductor substrate, each second electronic device including a second region comprising a second conductive layer projecting from said semiconductor substrate; and
a second sealing layer on said plurality of second electronic devices including sidewalls thereof, and on portions of said first sealing layer and on said protective spacers for said plurality of first electronic devices, said second sealing layer covering top portions of said second regions of said plurality of second electronic devices, with said first sealing layer between the top portions and said second sealing layer.

22. An integrated circuit according to claim 21, wherein each protective layer comprises a silicon nitride layer.

23. An integrated circuit according to claim 21, wherein a thickness of said second sealing layer is less than a thickness of said first sealing layer.

24. An integrated circuit according to claim 21, wherein said second sealing layer is directly on said first sealing layer.

25. An integrated circuit according to claim 21, wherein said first sealing layer is adjacent said semiconductor substrate between said plurality of first electronic devices; and further comprising a first insulating layer between said semiconductor substrate and said first regions, and adjacent said semiconductor substrate between said plurality of first electronic devices.

26. An integrated circuit according to claim 25, wherein said first sealing layer is adjacent said first insulating layer between said plurality of first electronic devices.

27. An integrated circuit according to claim 21, wherein said plurality of first electronic devices comprises a plurality of now-volatile memory cells, and wherein said at least one conductive layer projecting from said semiconductor substrate forms gate regions for said plurality of non-volatile memory cells; and wherein said plurality of second electronic devices comprises a plurality of transistors, and wherein said conductive layer projecting from said semiconductor substrate forms gate regions for said plurality of transistors.

28. An integrated circuit according to claim 21, wherein a thickness of said first sealing layer is within a range of about 3 to 15 nm; and wherein a thickness of said second sealing layer is within a range of about 1 to 4 nm.

29. An integrated circuit comprising:
a semiconductor substrate including first and second portions;
a plurality of memory cells adjacent the first portion of said semiconductor substrate;
a first sealing layer on said plurality of memory cells including sidewalls thereof;
protective spacers on said first sealing layer for the plurality of memory cells, each protective spacer comprising a protective layer;
a plurality of transistors adjacent the second portion of said semiconductor substrate; and
a second sealing layer on said plurality of transistors including sidewalls thereof and directly on said first sealing layer.

30. An integrated circuit according to claim 29, wherein each protective layer comprises a silicon nitride layer.

31. An integrated circuit according to claim 29, wherein a thickness of said second sealing layer is different from a thickness of said first sealing layer.

32. An integrated circuit according to claim 29, wherein said first sealing layer is also between said plurality of second electronic devices and said second sealing layer; and wherein said second sealing layer is adjacent sidewalls of said plurality of transistors.

33. An integrated circuit according to claim 29, wherein a thickness of said first sealing layer is within a range of about 3 to 15 nm; and wherein a thickness of said second sealing layer is within a range of about 1 to 4 nm.

34. An integrated circuit comprising:
a semiconductor substrate including first and second portions;
a plurality of first electronic devices adjacent the first portion of said semiconductor substrate, each first electronic device including a first region comprising at least one first conductive layer projecting from said semiconductor substrate;
first spacers on sidewalls of the first regions of said plurality of first electronic devices, said first spacers defined by a first sealing layer, a protective layer on said first sealing layer and a second sealing layer on said protective layer;
a plurality of second electronic devices adjacent the second portion of said semiconductor substrate, each second electronic device including a second region comprising a second conductive layer projecting from said semiconductor substrate; and
second spacers on sidewalls of the second regions of said plurality of second electronic devices, said second spacers defined by other portions of the second sealing layer, said second sealing layer covering top portions of said second regions of said plurality of second electronic devices, with said first sealing layer between the top portions and said second sealing layer.

35. An integrated circuit according to claim 34, wherein said protective layer comprises a silicon nitride layer.

36. An integrated circuit according to claim 34, wherein a thickness of said second sealing layer is less than a thickness of said first sealing layer.

37. An integrated circuit according to claim 34, wherein said second sealing layer is directly on said first sealing layer; and wherein said second sealing sayer is directly on sidewalls of said second regions.

38. An integrated circuit according to claim 34, wherein said first sealing layer is adjacent said semiconductor substrate between said plurality of first electronic devices.

39. An integrated circuit according to claim 34, wherein said plurality of first electronic devices comprise a plurality of nonvolatile memory cells; and wherein the at least one first conductive layer projecting from said semiconductor substrate forms gate regions for said plurality of nonvolatile memory cells; and wherein said plurality of second electronic devices comprise a plurality of transistors; and wherein the second conductive layer projecting from said semiconductor substrate forms gate regions for said plurality of transistors.

40. An integrated circuit according to claim 34, wherein a thickness of said first sealing layer is within a range of about 3 to 15 nm; and wherein a thickness of said second sealing layer is within a range of about 1 to 4 nm.

41. An integrated circuit according to claim 34, further comprising an insulating layer between said semiconductor substrate and the first regions, and between said semiconductor substrate and said first sealing layer.

* * * * *